US 9,184,267 B1

(12) United States Patent
Lin (10) Patent No.: US 9,184,267 B1
(45) Date of Patent: Nov. 10, 2015

(54) POWER SEMICONDUCTOR DEVICE AND METHOD FOR MANUFACTURING THE SAME

(71) Applicant: CHUNG HUA UNIVERSITY, Hsinchu (TW)

(72) Inventor: Jium Ming Lin, Hsinchu (TW)

(73) Assignee: CHUNG HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/448,056

(22) Filed: Jul. 31, 2014

(51) Int. Cl.
  *H01L 29/73* (2006.01)
  *H01L 29/739* (2006.01)
  *H01L 29/66* (2006.01)
  *H01L 21/768* (2006.01)

(52) U.S. Cl.
  CPC ...... *H01L 29/7393* (2013.01); *H01L 21/76877* (2013.01); *H01L 21/76883* (2013.01); *H01L 21/76898* (2013.01); *H01L 29/66325* (2013.01)

(58) Field of Classification Search
  CPC .............. H01L 2924/1305; H01L 2224/73265; H01L 2924/00012; H01L 2224/48465; H01L 2224/32245; H01L 2224/0345; H01L 2924/0132; H01L 2224/05624; H01L 2924/01029; H01L 29/732; H01L 29/0692; H01L 29/7395
  See application file for complete search history.

(56) References Cited

U.S. PATENT DOCUMENTS

| | | | | |
|---|---|---|---|---|
| 6,633,075 B1 * | 10/2003 | Shirakawa | .................... | 257/565 |
| 7,622,357 B2 * | 11/2009 | Vaed et al. | .................... | 438/309 |
| 2014/0264433 A1 * | 9/2014 | Hu et al. | ........................ | 257/139 |

* cited by examiner

*Primary Examiner* — Roy Potter
*Assistant Examiner* — Paul Patton
(74) *Attorney, Agent, or Firm* — WPAT, P.C.; Anthony King (57) ABSTRACT

A power semiconductor device comprises a substrate, a first electrode, a conductive layer, at least one electrical connecting element, a plurality of doped semiconductor layers, an insulating layer, and a second electrode. The first electrode is formed on a surface of the substrate. The conductive layer is formed on another surface of the substrate. The electrical connecting element is formed through the substrate and electrically connects the first electrode and the conductive layer. The doped semiconductor layers are stacked on the conductive layer. The upper most semiconductor layer comprises two doped sub-regions. The insulating layer is formed on the plurality of doped semiconductor layers. The second electrode is formed on the insulating layer and at least extends on an area between the doped sub-regions.

14 Claims, 6 Drawing Sheets

POWER SEMICONDUCTOR DEVICE AND METHOD FOR MANUFACTURING THE SAME

BACKGROUND

1. Technical Field

The present invention relates to a power semiconductor device and a method for manufacturing the same.

2. Related Art

Power semiconductor devices have wide applications. For example, power transistors can be found in electronic equipment or apparatuses, such as air conditioners, elevators, public transport systems, neon lights for multimedia demonstrations, and display panels. Thus, it can be observed that power semiconductor devices are key components of power electronic appliances.

A conventional manufacturing method for power transistors includes multiple semiconductor processes, which involve considerable outlay of manpower, time, and cost. The processes consume much water for washing away chemicals. Water supplied for the semiconductor processes is always reduced to meet domestic water demands. Production lines may be halted if water shortages worsen. Some processes, for example, impurity diffusion and oxidation, are conducted in high temperature ovens, and therefore, the processes for manufacturing semiconductor devices are not environmental.

SUMMARY

In at least one embodiments, a power semiconductor device comprises a substrate including a first surface and a second surface opposite to the first surface, a first electrode formed on the first surface, a conductive layer formed on the second surface, at least one connecting element formed through the substrate and configured to electrically connect the first electrode and the conductive layer, a first doped semiconductor layer formed on the conduction layer, a second doped semiconductor layer formed on the first doped semiconductor layer, a third doped semiconductor layer formed on the second doped semiconductor layer and comprising two doped sub-regions, an insulating layer formed on the third doped semiconductor layer, and a second electrode formed on the insulating layer and at least extending on an area between the two doped sub-regions.

In at least one embodiments, a method for manufacturing a power semiconductor device comprises forming at least one through hole on a substrate; disposing a conductive material to fill the through hole and cover opposite surfaces of the substrate so as to obtain a first electrode, a conductive layer, and an electrical connecting element in the through hole; using a first powder including a semiconductor material and a trivalent element to form a first doped semiconductor layer on the conductive layer; using a second powder including a semiconductor material and a pentavalent element to form a second doped semiconductor layer on the first doped semiconductor layer; using a third powder including a semiconductor material and a pentavalent element to form a third doped semiconductor layer on the second doped semiconductor layer; forming two doped regions in the third doped semiconductor layer; forming a doped sub-region in each doped region; disposing an insulation layer on the third doped semiconductor layer; and forming a conductor on the insulation layer and between the two doped sub-regions.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF DISCLOSED EMBODIMENTS

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

Figure 1:
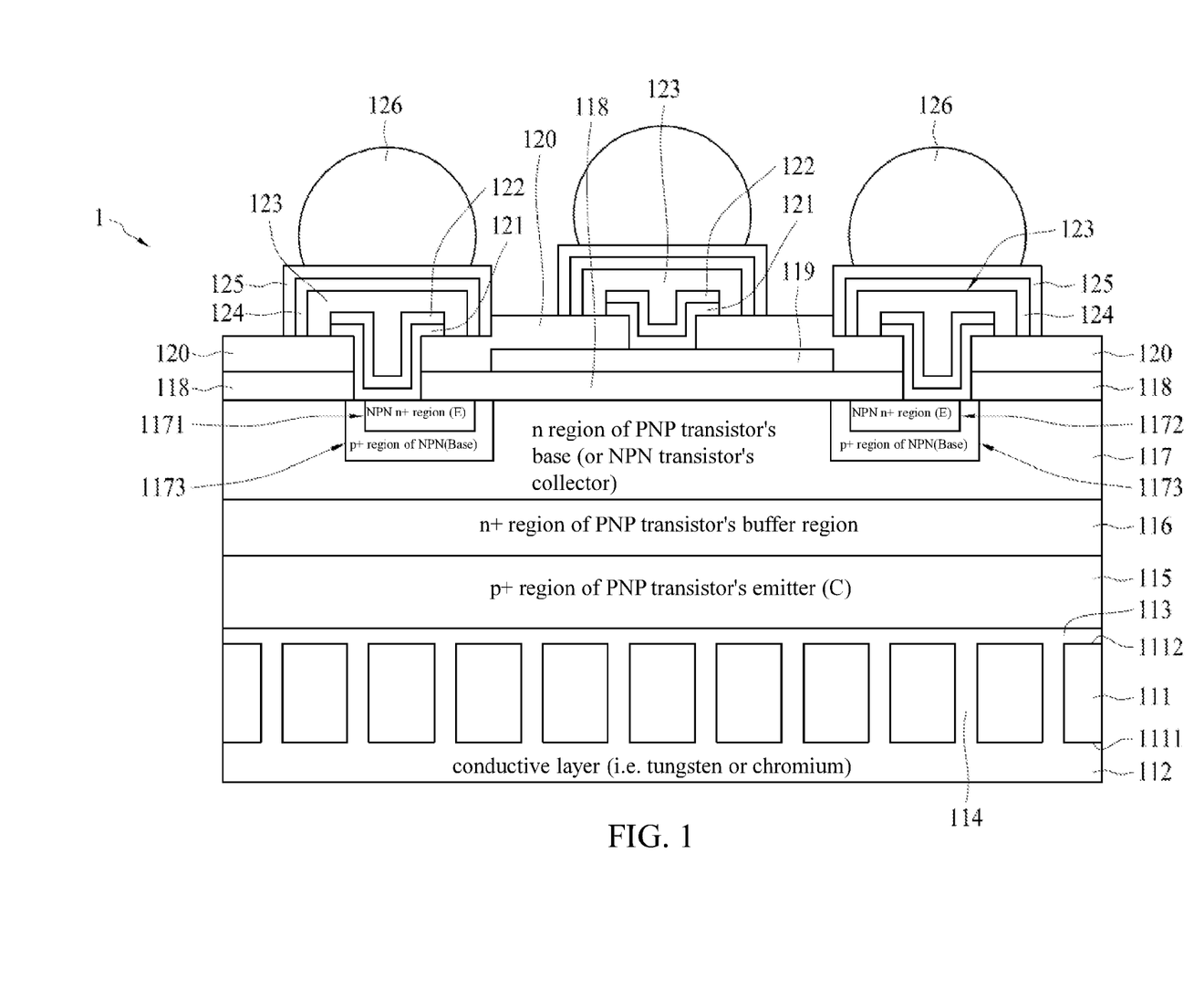
FIG. 1 is a schematic view showing a power semiconductor device according to one embodiment.

Referring to FIG. 1, a power semiconductor device 1 comprises a substrate 111, a first electrode 112, a conductive layer 113, at least one connecting element 114, a first doped semiconductor layer 115, a second doped semiconductor layer 116, a third doped semiconductor layer 117, an insulating layer 118, and a second electrode 119. In some embodiments, the power semiconductor device 1 comprises an insulated gate bipolar transistor (IGBT).

The substrate 111 comprises a first surface 1111 and a second surface 1112, which is opposite to the first surface 1111. The substrate 111 has a good heat dissipation capability. The substrate 111 can have a low coefficient of thermal expansion. The substrate 111 may be a dielectric substrate.

The entire first electrode 112 can be formed on the first surface 1111 of the substrate 111. The first electrode 112 comprises tungsten, chromium, or other conductors having high melting points. In some embodiments, the first electrode 112 is a collector.

The entire conductive layer 113 can be formed on the second surface 1112 of the substrate 111. The conductive layer 113 comprises tungsten, chromium, or other conductors having high melting points.

The at least one connecting element 114 is formed through the substrate 111 and electrically connects the first electrode 112 and the conductive layer 113. The at least one connecting element 114 comprises tungsten, chromium, or other conductors having high melting points. In some embodiments, the first electrode 112, the conductive layer 113, and the at least one connecting element 114 are formed in the same process step. In some embodiments, the first electrode 112, the conductive layer 113, and the at least one connecting element 114 may be formed in different process steps.

The entire first doped semiconductor layer 115 may be formed on the conductive layer 113. In some embodiments, the first doped semiconductor layer 115 comprises p doped semiconductor layer. In some embodiments, the first doped semiconductor layer 115 comprises a p+ doped semiconductor layer. In some embodiments, the first doped semiconductor layer 115 comprises an n doped semiconductor layer. In some embodiments, the first doped semiconductor layer 115 comprises an n+ doped semiconductor layer. In some embodiments, the first doped semiconductor layer 115 comprises silicon. In some embodiments, the first doped semiconductor layer 115 comprises silicon carbide (SiC). In some embodiments, the first doped semiconductor layer 115 comprises a trivalent element. In some embodiments, the first doped semiconductor layer 115 comprises boron. In some embodiments, the first doped semiconductor layer 115 comprises a pentavalent element. In some embodiments, the first doped semiconductor layer 115 comprises phosphor.

The entire second doped semiconductor layer 116 can be formed on the first doped semiconductor layer 115. In some embodiments, the second doped semiconductor layer 116 comprises an n doped semiconductor layer. In some embodiments, the second doped semiconductor layer 116 comprises an n+ doped semiconductor layer. In some embodiments, the second doped semiconductor layer 116 comprises a p doped semiconductor layer. In some embodiments, the second doped semiconductor layer 116 comprises a p+ doped semiconductor layer. In some embodiments, the second doped semiconductor layer 116 comprises silicon. In some embodiments, the second doped semiconductor layer 116 comprises silicon carbide (SiC). In some embodiments, the second doped semiconductor layer 116 comprises a pentavalent element. In some embodiments, the second doped semiconductor layer 116 comprises phosphor. In some embodiments, the second doped semiconductor layer 116 comprises a trivalent element. In some embodiments, the second doped semiconductor layer 116 comprises boron.

The entire third doped semiconductor layer 117 may be formed on the second doped semiconductor layer 116. In some embodiments, the third doped semiconductor layer 117 comprises an n doped semiconductor layer. In some embodiments, the third doped semiconductor layer 117 comprises a p doped semiconductor layer. In some embodiments, the third doped semiconductor layer 117 comprises silicon. In some embodiments, the third doped semiconductor layer 117 comprises SiC. In some embodiments, the third doped semiconductor layer 117 comprises a pentavalent element. In some embodiments, the third doped semiconductor layer 117 comprises phosphor. In some embodiments, the third doped semiconductor layer 117 comprises a trivalent element. In some embodiments, the third doped semiconductor layer 117 comprises boron.

In addition, the third doped semiconductor layer 117 may comprise two doped sub-regions 1171 and 1172. In some embodiments, the doped sub-regions 1171 and 1172 comprise n doped sub-regions. In some embodiments, the doped sub-regions 1171 and 1172 comprise n+ doped sub-regions. In some embodiments, the doped sub-regions 1171 and 1172 comprise p doped sub-regions. In some embodiments, the doped sub-regions 1171 and 1172 comprise p+ doped sub-regions.

The doped sub-regions 1171 and 1172 may be respectively in a doped region 1173. In some embodiments, the doped region 1173 comprises a p+ doped region.

The insulating layer 118 is formed on the third doped semiconductor layer 117. In some embodiments, the insulating layer 118 comprises silicon dioxide. In some embodiments, the insulating layer 118 has a thickness of 500 Å (angstrom); but the present invention is not limited to such a value.

The second electrode 119 is formed on the insulating layer 118. The insulating layer 118 at least extends on or over an area between the two doped sub-regions 1171 and 1172. The second electrode 119 may be a gate electrode. In some embodiments, the second electrode 119 comprises a conductor. In some embodiments, the second electrode 119 comprises an n+ semiconductor. In some embodiments, the second electrode 119 comprises doped silicon. In some embodiments, the second electrode 119 comprises doped silicon carbide.

Referring to FIG. 1, the power semiconductor device 1 may comprise another insulating layer 120, which may be configured to cover the second electrode 119 and the insulating layer 118. In some embodiments, the insulating layer 120 comprises silicon dioxide.

As shown in the middle portion of FIG. 1, the power semiconductor device 1 may comprise a chromium layer 121 and a nickel layer 122. The chromium layer 121 and the nickel layer 122 may be at least formed on the insulating layer 120 and cover the portion of the second electrode 119 that is exposed outside through a hole for external electrical connection so as to contact the second electrode 119. Moreover, as shown in the portion of FIG. 1 where the two doped sub-regions 1171 and 1172 are located, the chromium layer 121 and the nickel layer 122 can be at least formed on the insulating layers 118 and 120 and respectively cover the portions of the two doped sub-regions 1171 and 1172 that are exposed out for external electrical connections so as to contact the two doped sub-regions 1171 and 1172.

Referring to FIG. 1, the power semiconductor device 1 may comprise a plurality of conductors 123. Each conductor 123 covers a corresponding chromium layer 121 and nickel layer 122 and is formed over the insulating layer 120. In some embodiments, the conductor 123 comprises copper.

Referring to FIG. 1, a nickel layer 124 and a gold layer 125 may be formed on each conductor 123. In some embodiments, the nickel layer 124 and the gold layer 125 cover the corresponding conductor 123.

Referring to FIG. 1, a bump 126 is disposed on each gold layer 125. In some embodiments, the bump 126 comprises an Sn—Ag—Cu alloy.

In some embodiments, the second electrode 119 and the two doped regions 1173 are all formed right over the first electrode 112 or the conductive layer 113.

In some embodiments, the first electrode 112 covers the entire first surface 1111 of the substrate 111 of the power semiconductor device 1. In some embodiments, the conductive layer 113 covers the entire second surface 1112 of the substrate 111 of the power semiconductor device 1.

Figure 2:
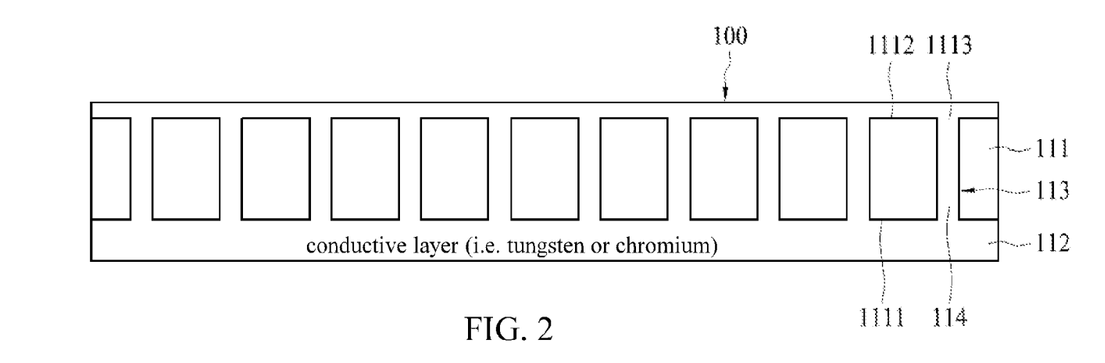
FIGS. 2 to 7 are cross-sectional views showing a method for manufacturing a power semiconductor device according to one embodiment.

One embodiment of the present invention discloses a method for manufacturing a power semiconductor device. Referring to FIG. 2, at least one through hole 1113 is formed on a substrate 111. Next, an electrically conductive material 100 is disposed to fill the through hole 1113 and cover the first and second surfaces 1111 and 1112 of the substrate 111. In some embodiments, the conductive material 100 is screen-printed on the substrate 111, and then, the substrate 111 and the conductive material 100 are cofired to form the first electrode 112, the electrical connecting element 114, and the conductive layer 113.

Figure 3:
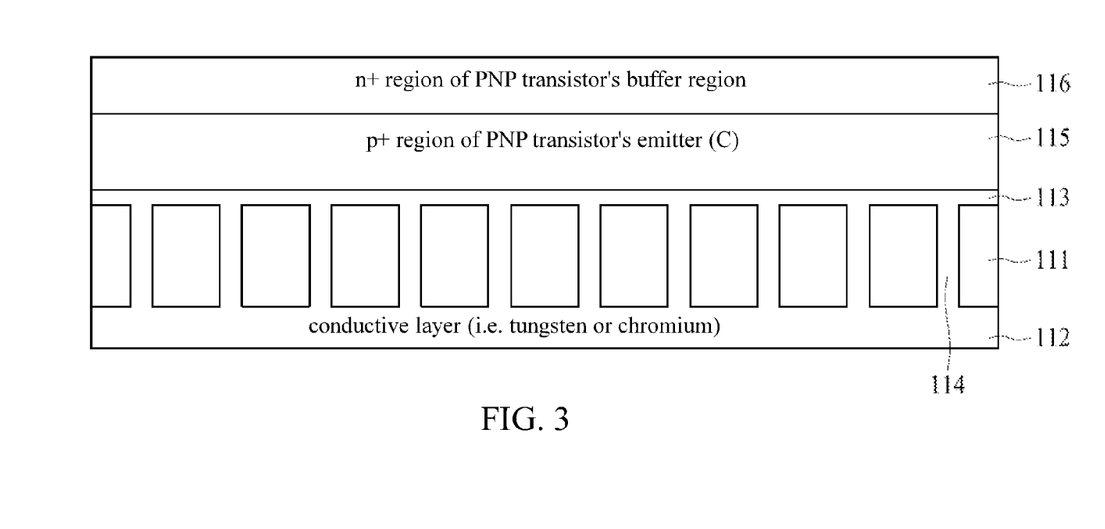

Referring to FIG. 3, a first powder is vapor-deposited on the conductive layer 113 to form a first doped semiconductor layer 115. The first powder comprises a semiconductor material and a trivalent element. In some embodiments, the method comprises using an electron gun to vapor-deposit the first powder. In some embodiments, the method comprises using a 3D additive laminate manufacturing technology to spray the mixing powder including a semiconductor material and a trivalent element in a vacuum, and then, conducting a laser-recrystallization process on the sprayed product. In some embodiments, the semiconductor material comprises silicon or silicon carbide. In some embodiments, the trivalent element comprises boron. In some embodiments, the first doped semiconductor layer 115 is an emitter of a PNP transistor.

Referring to FIG. 3, a second powder is vapor-deposited on the first doped semiconductor layer 115 to form a second doped semiconductor layer 116. The second powder comprises a semiconductor material and a pentavalent element. In some embodiments, the method comprises using an electron gun to vapor-deposit the second powder. In some embodiments, the method comprises using a 3D additive laminate manufacturing technology to spray the mixing powder including a semiconductor material and a pentavalent element in a vacuum, and then, conducting a laser-recrystallization process on the sprayed product. In some embodiments, the semiconductor material comprises silicon or silicon carbide. In some embodiments, the pentavalent element comprises phosphor. In some embodiments, the second doped semiconductor layer 116 is a buffer region of a PNP transistor.

Figure 4:
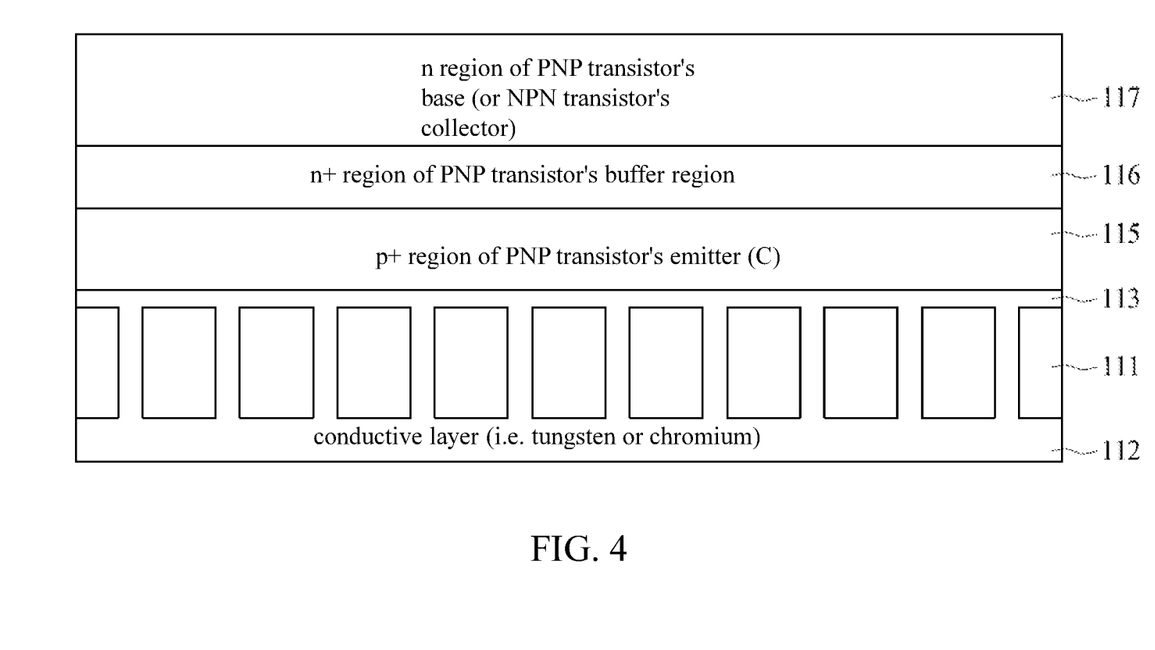

Referring to FIG. 4, a third powder is vapor-deposited on the second doped semiconductor layer 116 to form a third doped semiconductor layer 117. The third powder comprises a semiconductor material and a pentavalent element. In some embodiments, the method comprises using an electron gun to vapor-deposit the third powder. In some embodiments, the method comprises using a 3D additive laminate manufacturing technology to spray the mixing powder including a semiconductor material and a pentavalent element in a vacuum, and then, conducting a laser-recrystallization process on the sprayed product. In some embodiments, the semiconductor material comprises silicon or silicon carbide. In some embodiments, the pentavalent element comprises phosphor. In some embodiments, the third doped semiconductor layer 117 is a collector of an NPN transistor.

Figure 5:
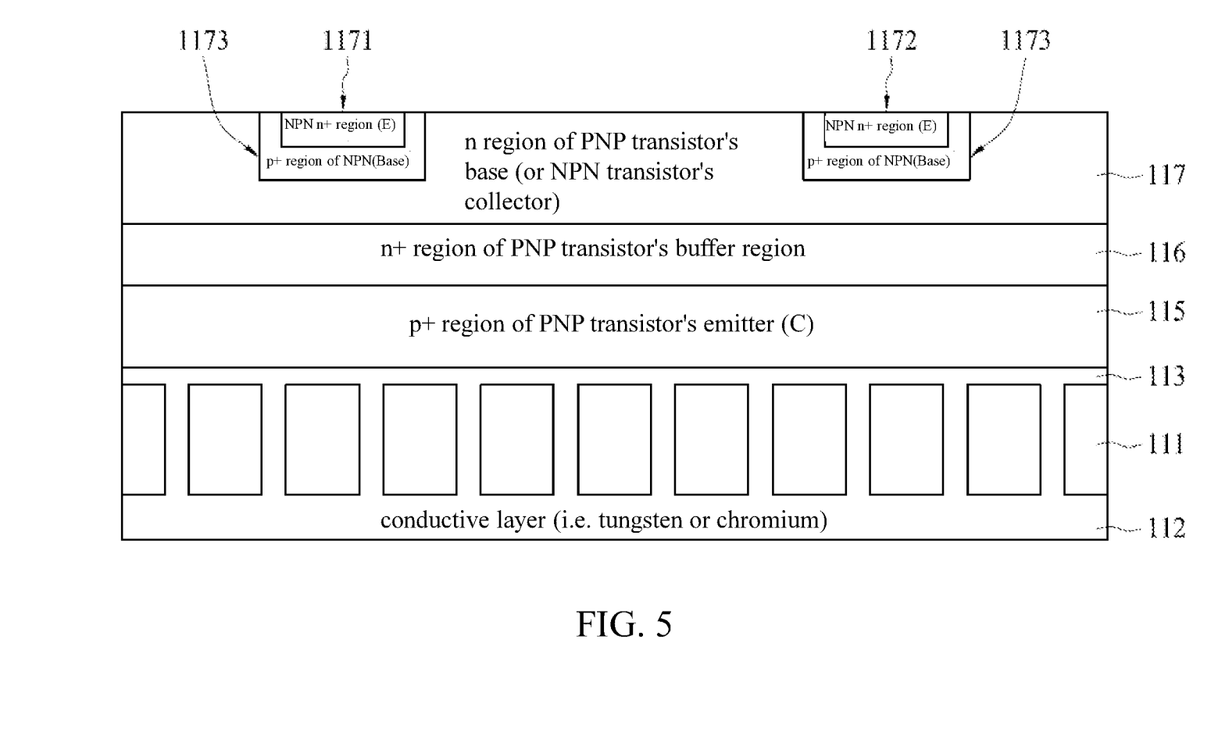

Referring to FIG. 5, two doped regions 1173 are formed on the third doped semiconductor layer 117, and a doped sub-region 1171 or 1172 is formed in each doped region 1173. In some embodiments, a photoresist is coated on the third doped semiconductor layer 117 and baked to dry. Next, a mask and a photolithography process are applied to remove the portion of the photoresist below which a p+ doped region as a base of an NPN transistor is to be formed. Thereafter, an ion implantation process is used to implant trivalent ions, for example boron ions, into the third doped semiconductor layer 117 so as to form a p+ doped region 1173 for a base of an NPN transistor. Furthermore, a photolithography process and an ion implantation process are used to form an n+ doped region or a doped sub-region 1171 or 1172 in each doped region 1173 as an emitter of an NPN transistor. Moreover, the substrate 111 is annealed in a temperature of from 750 to 1050 degrees Celsius such that all vapor-deposited semiconductor layers can be transformed into a polycrystalline structure or a single crystal structure. As a result, a reverse breakdown voltage can be increased, and a threshold voltage and reverse leakage current can be decreased.

Figure 6:
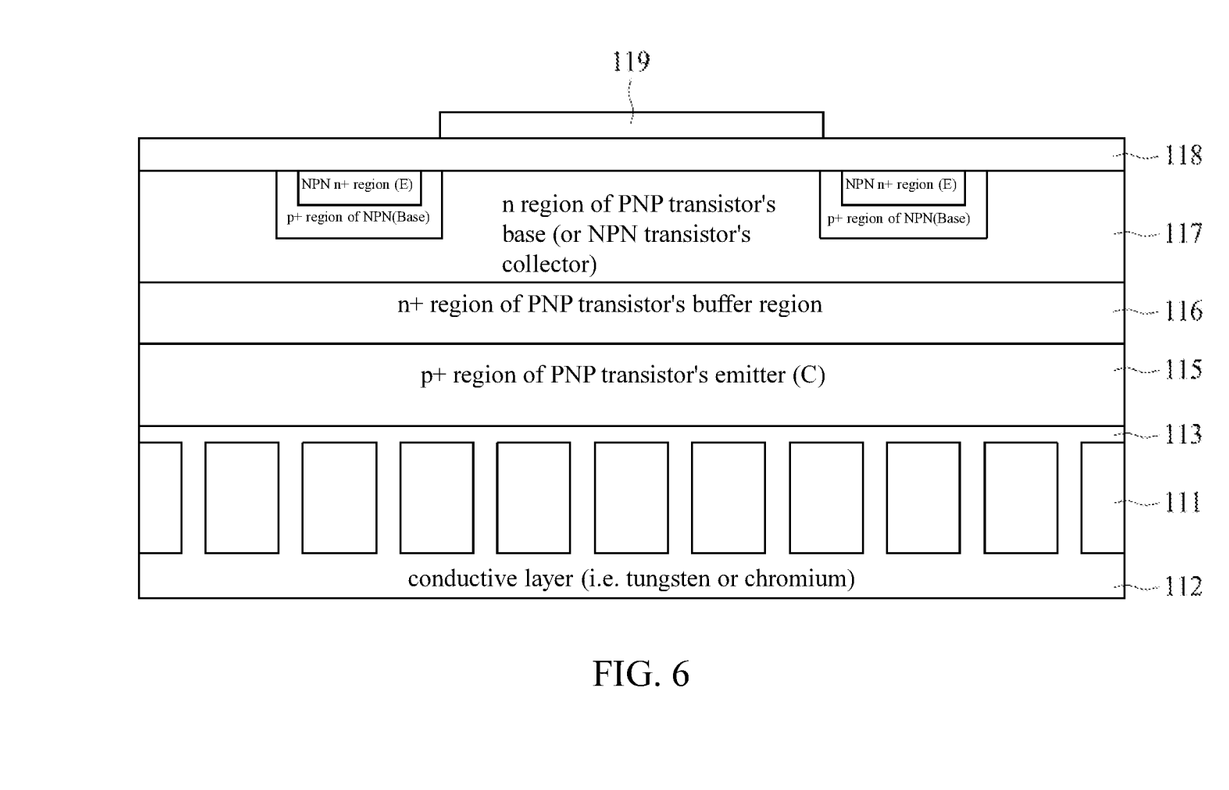

Referring to FIG. 6, an insulating layer 118 is deposited on the third doped semiconductor layer 117. A conductor is formed on the insulating layer 118, located between the two doped sub-regions 1171, and configured as a second electrode 119. In some embodiments, the insulating layer 118, such as a silicon dioxide layer with a thickness of 500 Å, is formed by vapor-deposition and configured as an insulating layer for a gate electrode of the power semiconductor device 1. An n+ doped semiconductor layer, such as a silicon or silicon carbide layer, is formed by vapor deposition. The n+ doped semiconductor layer is then defined as a gate electrode (silicon gate) or a second electrode 119 by a mask and a photolithography process.

Figure 7:
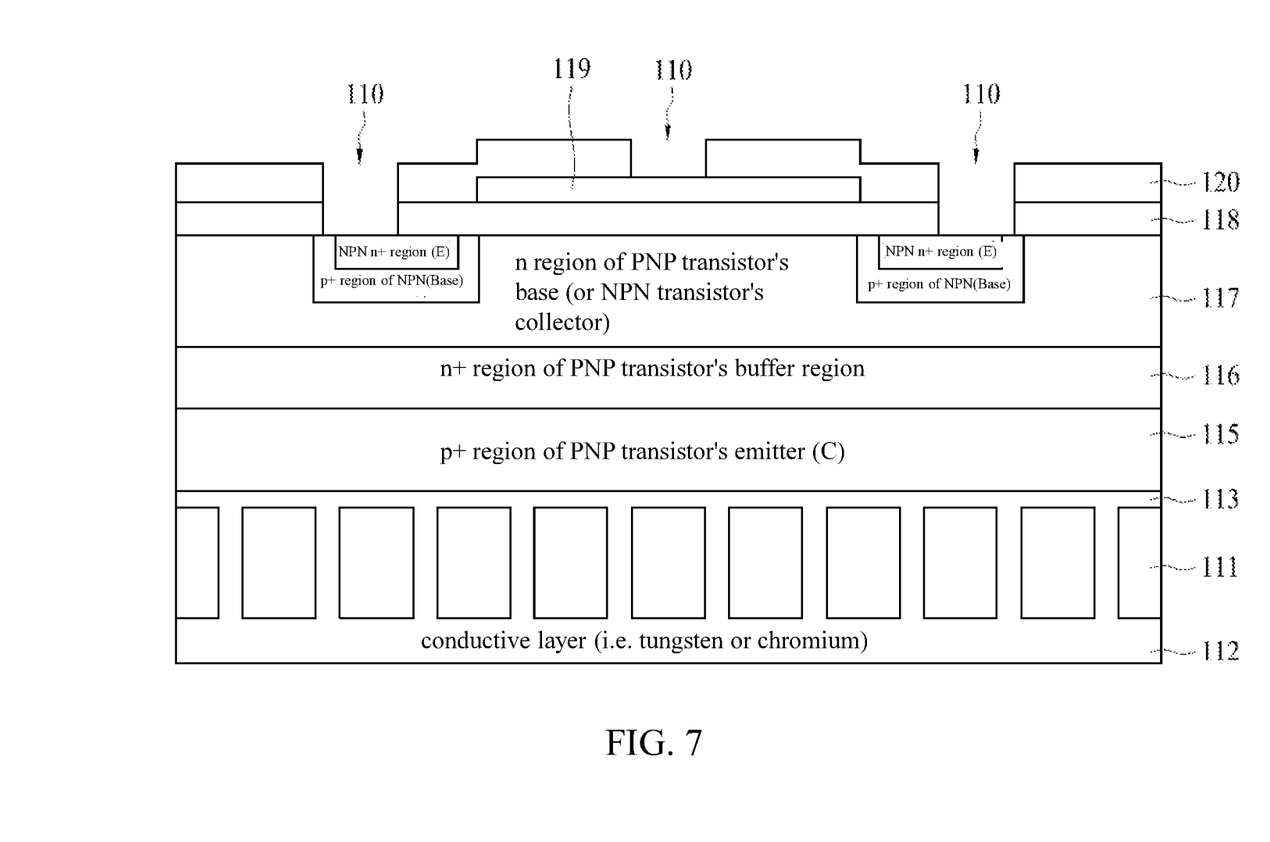

Referring to FIG. 7, an insulating layer 120, such as a silicon dioxide layer with a thickness of 5000 Å, is formed by vapor deposition, which covers the second electrode 119 and the insulating layer 118. A mask and a photolithography process are used to define contact holes 110 for the emitter and gate electrode so as to connect with external connections.

Referring to FIG. 1, a chromium layer and a nickel layer is formed by a sputtering process. The chromium layer and the nickel layer extend into the contact holes 110. The chromium layer and the nickel layer can be used as a diffusion barrier layer and a seed layer for disposing Under Bumped Metals (UBMs) located beneath bumps into the holes 110. Thereafter, a mask and a photolithography process are used to define contact pads for the emitter, the gate electrode and connection wires. Next, copper is electrically plated to form a conductor 123. Further, nickel and gold is used to form UBMs for connecting bumps 126. The purpose of forming an external gold layer is due to the effective wettability of gold. Finally, material including Sn—Ag—Cu alloy is screen-printed and then reflowed to form bumps 126 for external electrical connections.

In general, large currents will flow through the emitter of the power semiconductor device 1 and cause huge power dissipation and high temperatures; therefore, the number of external connection terminals is increased to lower parasitic resistance and separately dissipate heat. The collector is formed on another surface of the power semiconductor device 1 so that the collector can easily connect with external wires and facilitate heat dissipation due to a large area of the collector. In addition, the power semiconductor device 1 can be manufactured by a 3D additive laminate manufacturing technology, which can shorten manufacturing time, reduce process steps, and move times between tools. The manpower, time, and cost can be significantly reduced and the manufacturing efficiency can be increased.

It will be apparent to those skilled in the art that various modifications and variations can be made to the disclosed embodiments. It is intended that the specification and examples be considered as exemplary only, with a true scope of the disclosure being indicated by the following claims and their equivalent.

What is claimed is:

1. A power semiconductor device comprising:
   a substrate including a first surface and a second surface opposite to the first surface;
   a first electrode formed on the first surface;
   a conductive layer formed on the second surface;
   at least one connecting element formed through the substrate and configured to electrically connect the first electrode and the conductive layer;
   a first doped semiconductor layer formed on the conductive layer;
   a second doped semiconductor layer formed on the first doped semiconductor layer;
   a third doped semiconductor layer formed on the second doped semiconductor layer and comprising two doped sub-regions;
   an insulating layer formed on the third doped semiconductor layer; and
   a second electrode formed on the insulating layer and at least extending on an area between the two doped sub-regions;
   wherein the substrate is a dielectric substrate;

wherein the first doped semiconductor layer, the second doped semiconductor layer, the third doped semiconductor layer, the insulating layer and the second electrode are disposed over the first electrode and the conductive layer.

2. The power semiconductor device of claim 1, wherein the two doped sub-regions are respectively in a doped region.

3. The power semiconductor device of claim 2, wherein the two doped sub-regions comprise n+ doped sub-regions, and the doped region comprises p+ doped region.

4. The power semiconductor device of claim 3, wherein the first electrode is a collector and the second electrode is a gate electrode.

5. The power semiconductor device of claim 1, wherein the first doped semiconductor layer comprises a p+ doped semiconductor layer.

6. The power semiconductor device of claim 1, wherein the second doped semiconductor layer comprises an n+ doped semiconductor layer.

7. The power semiconductor device of claim 1, wherein the third doped semiconductor layer comprises an n doped semiconductor layer.

8. The power semiconductor device of claim 1, wherein the substrate comprises aluminum nitride or aluminum oxide.

9. The power semiconductor device of claim 1, wherein the first electrode comprises tungsten or chromium.

10. A method for manufacturing a power semiconductor device, comprising:
    forming at least one through hole on a substrate;
    disposing a conductive material to fill the through hole and cover opposite surfaces of the substrate so as to obtain a first electrode, a conductive layer, and an electrical connecting element in the through hole;
    using a first powder including a semiconductor material and a trivalent element to form a first doped semiconductor layer on the conductive layer;
    using a second powder including a semiconductor material and a pentavalent element to form a second doped semiconductor layer on the first doped semiconductor layer;
    using a third powder including a semiconductor material and a pentavalent element to form a third doped semiconductor layer on the second doped semiconductor layer;
    forming two doped regions in the third doped semiconductor layer;
    forming a doped sub-region in each doped region;
    disposing an insulation layer on the third doped semiconductor layer; and
    forming a conductor on the insulation layer and between the two doped sub-regions.

11. The method of claim 10, wherein the step of disposing a conductive material comprises:
    screen-printing the conductive material; and
    cofiring the conductive material.

12. The method of claim 10, further comprising an annealing step, which is performed after the step of forming a doped sub-region in each doped region.

13. The method of claim 10, wherein the step of using a first powder comprises a step of vapor-depositing the first powder, the step of using a second powder comprises a step of vapor-depositing the second powder, and the step of using a third powder comprises a step of vapor-depositing the third powder.

14. The method of claim 10, wherein the step of using a first powder comprises a step of spraying and laser-recrystallizing the first powder, the step of using a second powder comprises a step of spraying and laser-recrystallizing the second powder, and the step of using a third powder comprises a step of spraying and laser-recrystallizing the third powder.

* * * * *